United States Patent [19]
Kinpara et al.

[11] Patent Number: 5,976,971
[45] Date of Patent: *Nov. 2, 1999

[54] FABRICATION PROCESS OF A SEMICONDUCTOR DEVICE HAVING AN INTERCONNECTION STRUCTURE

[75] Inventors: Shigeru Kinpara, Hyogo-Ken; Katsunari Hanaoka, Ono; Ikue Kawashima, Kobe; Kazunori Ito, Kakogawa, all of Japan

[73] Assignee: Ricoh Company, Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/685,177

[22] Filed: Jul. 18, 1996

[30] Foreign Application Priority Data

Jul. 19, 1995 [JP] Japan ..................................... 7-206562
Jan. 31, 1996 [JP] Japan ..................................... 8-038763

[51] Int. Cl.$^6$ ................................................... H01L 21/44
[52] U.S. Cl. ........................... 438/637; 438/666; 438/700
[58] Field of Search .................................... 438/437, 631, 438/666, 700

[56] References Cited

U.S. PATENT DOCUMENTS

| | | |
|---|---|---|
| 4,714,686 | 12/1987 | Sander et al. . |
| 4,944,836 | 7/1990 | Beyer et al. . |
| 5,244,534 | 9/1993 | Yu et al. . |
| 5,286,675 | 2/1994 | Chen et al. . |
| 5,525,840 | 6/1996 | Tominaga . |
| 5,571,751 | 11/1996 | Chung . |
| 5,591,673 | 1/1997 | Chao et al. . |

FOREIGN PATENT DOCUMENTS 7-86276  3/1995  Japan .

*Primary Examiner*—Caridad Everhart
*Attorney, Agent, or Firm*—Cooper & Dunham LLP

[57] ABSTRACT

A method of fabricating a semiconductor device includes the steps of forming a contact hole in an insulator layer, filling the contact hole by a conductor material, removing the conductor material from the upper major surface of the insulator layer to form a conductive plug such that the conductive plug fills the contact hole, applying an anisotropic etching process upon the insulator layer, such that the anisotropic etching process acts substantially vertically and selectively to the insulator layer, with an etching rate substantially larger than an etching rate for the conducive plug.

8 Claims, 10 Drawing Sheets

F I G. 3A
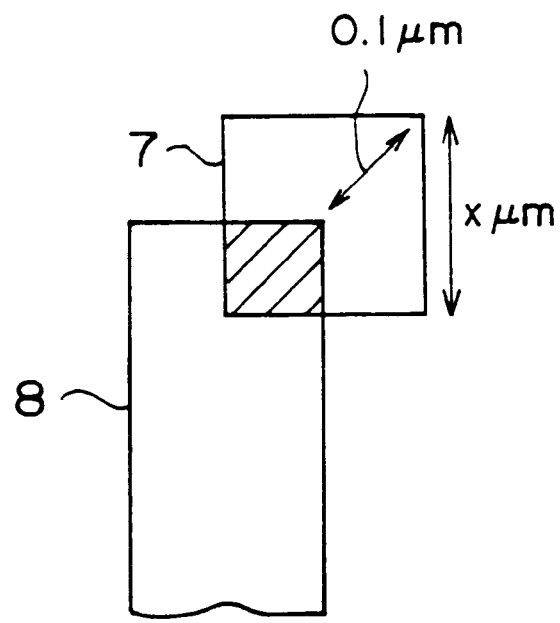
F I G. 3B
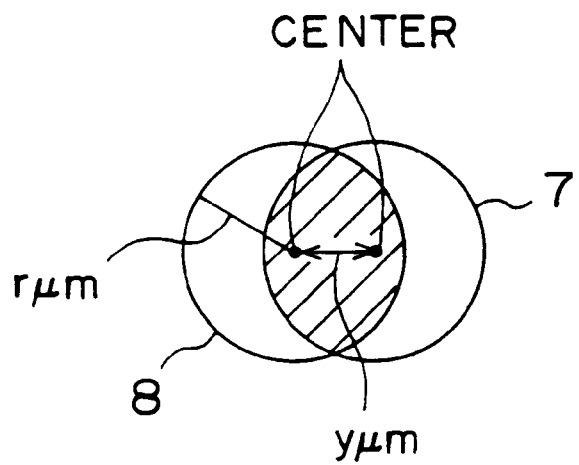

F I G. 10 A
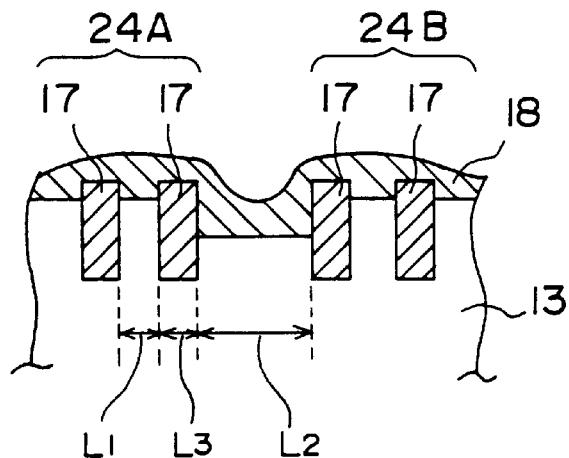
F I G. 10 B
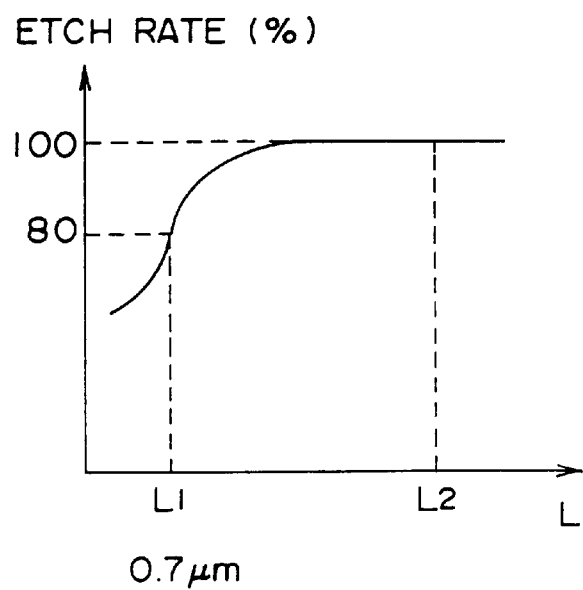
0.7 μm

FABRICATION PROCESS OF A SEMICONDUCTOR DEVICE HAVING AN INTERCONNECTION STRUCTURE

BACKGROUND OF THE INVENTION

The present invention generally relates to fabrication of semiconductor devices and more particularly to a fabrication process of a semiconductor device having an interconnection structure including a conductive plug filling a contact hole.

In semiconductor devices and integrated circuits that include a multilayer interconnection structure, a lower conductor pattern provided on a substrate is connected to an upper conductor pattern provided above the lower conductor pattern via a conductive plug filling a contact hole formed in an intervening interlayer insulation film.

When forming such a multilayer interconnection structure, an interlayer insulation film is provided so as to cover a lower conductor pattern formed on a substrate, followed by a process of formation of contact holes in the interlayer insulation film thus provided. Next, the contact holes are filled with a conductive material to form conductive plugs, and an upper conductor pattern is provided on the interlayer insulation film in electrical connection with the conductive plugs thus formed.

FIGS. 1A–1D show a conventional process for forming such a multilayer interconnection structure on a Si substrate 1.

Referring to FIG. 1A, a first layer metal pattern 2 is provided on the Si substrate 1, and an interlayer insulation film 3 is provided thereon such that the interlayer insulation film 3 covers the first layer metal pattern 2. Further, the interlayer insulation film 3 is provided with contact holes 4 exposing the first layer conductor pattern 2, together with other through holes 4a acting as an alignment mark.

Next, in the step of FIG. 1B, a conductor layer 5 is deposited on the structure of FIG. 1A such that the conductor layer 5 fills the contact holes 4 as well as the holes 4a, and the structure thus formed is subjected to an etch back process as indicated in FIG. 1C, in which the conductor layer 5 is removed by an RIE process applied substantially vertically to the layer 5, leaving behind conductor plugs 7 filling the contact holes 4 or the through holes 4a. Thereby, the RIE process is carried out slightly excessively such that no conductor material is left on the upper major surface of the interlayer insulation film 3. As a result of such an excessive etching, the top surface of the plug 7 is located at a level slightly lower than the upper major surface of the interlayer insulation film 3 as indicated by a recess 6.

Next, in the step of FIG. 1D, a conductor layer is deposited on the structure of FIG. 1C such that the conductor layer fills the contact holes 4 or the through hole 4a now partially filled by the conductor plug 7, wherein the conductor layer thus deposited establishes an electrical contact with the plugs 7 thus filling the holes 4 or 4a. In the step of FIG. 1D, the conductor layer is patterned further to form an upper conductor pattern or interconnection pattern 8.

In such a conventional process of forming a multilayer interconnection structure, there arises a problem, associated with the formation of the depression 6 in the contact hole 4, in that the reliability of electrical connection is poor at the contact between the upper interconnection pattern 8 and the conductive plug 7. Further, because of the filling of the through hole 4a by the plug 7, the alignment mark appearing on the upper major surface of the conductor pattern 8 in correspondence to the through hole 4a is substantially obscured.

In order to improve the reliability of the electrical contact, there is a proposal to planarize the structure of FIG. 1C by employing a chemical mechanical polishing (CMP) process as indicated in FIG. 2A (e.g., Beyer et al., U.S. Pat. No. 4,944,836), wherein the upper major surface of the interlayer insulation film 3 is polished, in the structure of FIG. 2A, to form a flush surface with the top surface of the conductive plugs 7. After the planarization process of FIG. 2A, a conductor layer is deposited on the planarized upper major surface of the insulation film 3 and patterned subsequently. Thereby, the conductor pattern 8 is formed as indicated in FIG. 2B.

In the process of FIGS. 2A and 2B, the problem of formation of the recess 6 is eliminated and the reliability of electrical contact at the contact holes 4 is improved. However, such a CMP process completely eliminates the alignment mark that appears on the upper major surface of the conductor pattern 8 in correspondence to the through holes 4a.

Further, in view of possible alignment error at the time of exposure and patterning, there is a possibility that both of the process of FIGS. 1A–1D and the process of FIGS. 2A and 2B cause an excessively increased current density at the part where the conductor pattern 8 contacts the conductive plug 7, as indicated in FIGS. 3A and 3B.

Referring to FIG. 3A showing the structure of FIG. 1D or FIG. 2B in a plan view, it will be noted that the conductor pattern 8 and the conductive plug 7 of a rectangular cross section cause a contact at the hatched region, wherein it will be noted in FIG. 3A that the conductor pattern 8 and the conductive plug 7 cause an overlap in the hatched region. In such a contact structure, a deviation at the time of the exposure of only 0.1 $\mu$m in the diagonal direction, as indicated in FIG. 3A by an arrow, causes a severe decrease of the contact area. In such a case, it should be noted that the contact area of FIG. 3A is represented as $(x-0.1/\sqrt{2})^2$, wherein x represents the length of the edge of the conductive plug 7. The foregoing relationship indicates that the alignment error causes a serious effect on the area of the contact and hence the current density, particularly in the case where the size of the plug as represented by the edge length x, is small.

In extremely fine semiconductor patterns such as the pattern of submicron devices, it is known that the corners of the rectangular patterns are rounded as a result of diffraction of exposure beam, even when a rectangular mask pattern is used for the exposure. Thus, in the actual submicron devices, the conductive plug is more closely approximated by a cylinder having a circular cross section than a rectangular block having a rectangular cross section.

FIG. 3B evaluates the effect of alignment error for the case where two conductive plugs, each having a circular cross section in the plan view, are contacted.

In such a case, the area of the contact, represented in FIG. 3B by hatching, is represented as $$2\{2\pi r^2 \cdot \cos^{-1}(y/2r)/360 - (2/y)r \cdot \sin(\cos^{-1}(y/2r))\}$$

where r represents the radius of the circular cross section of the plug, while y represents the deviation of the pattern caused by the alignment error.

For example, the contact area reduces to 77.7% of the nominal contact area for the plug having a radius r of 0.4 $\mu$m, when there exists an alignment error y of 0.1 $\mu$m. Further, the reduction of the contact area appears more significantly in the plugs of smaller diameters.

When the contact area is reduced as such, the current density increases as noted before, while such an increase in the current density in turn tends to invite failure of the contact by electromigration effect or by stress migration effect, and the lifetime of the contact is reduced substantially.

In order to avoid the problem of steep decrease of the contact area caused by the alignment error, one may form the conductive plugs such that each conductive plug protrudes in the upward direction from the upper major surface of the interlayer insulation film. By providing an conductor pattern on such an interlayer insulation film, it is possible to cause the conductor pattern to contact not only with the top surface of the conductive plug but also with the exposed side walls thereof. Thereby, the area of contact is increased substantially even in the case the upper conductor pattern contacts with only a part of the top surface of the conductive plug due to the alignment error.

As a method of forming a conductive plug such that the conductive plug protrudes from the upper major surface of an interlayer insulation film, the U.S. Pat. No. 5,244,534 describes the use of a CMP process including a first CMP step for polishing away a conductor layer from the upper major surface of the interlayer insulation film and a second CMP step for polishing the exposed upper major surface of the interlayer insulation film.

However, the process of the foregoing prior art reference is difficult to use in practice, particularly with regard to the selection of an appropriate abrasive slurry and setting of an appropriate polishing condition for the second polishing step. Thereby, the foregoing process is somewhat unpredictable and cannot be used for the production of semiconductor devices.

SUMMARY OF THE INVENTION

Accordingly, it is a general object of the present invention to provide a novel and useful method for fabricating a semiconductor device wherein the foregoing problems are eliminated.

Another and more specific object of the present invention is to provide a fabrication process of a semiconductor device including a step of forming a conductive plug embedded in an interlayer insulation film such that the conductive plug protrudes in an upward direction from an upper major surface of the interlayer insulation film, as well as a semiconductor device fabricated according to such a fabrication process, wherein the formation of the foregoing structure is reproduced with reliability.

Another object of the present invention is to provide a method of fabricating a semiconductor device, comprising the steps of:

forming an insulator layer on a semiconductor substrate;

forming a contact hole in said insulator layer such that said contact hole extends from an upper major surface of said insulator layer to a lower major surface of said insulator layer;

depositing a conductor layer on said insulator layer such that said conductor layer fills said contact hole;

removing said conductor layer from said upper major surface of said insulator layer, said removing step thereby forming a conductive plug, of a conductive material identical to a conductive material forming the conductor layer, such that the conductive plug fills said contact hole;

after said conductive plug is formed, applying an anisotropic etching process upon said insulator layer, such that said anisotropic etching process acts substantially vertically and selectively to said insulator layer, with an etching rate substantially larger than an etching rate for said conducive plug.

Another object of the present invention is to provide a semiconductor device comprising:

a semiconductor substrate;

a lower conductor pattern provided on said semiconductor substrate;

an insulator layer provided on said semiconductor substrate so as to cover said lower conductor pattern, said insulator layer having an upper major surface;

a contact hole provided in said insulator layer so as to expose a part of said lower conductor pattern;

a conductive plug filling said contact hole, said conductive plug protruding from said upper major surface of said insulator layer by at least 0.1 $\mu$m; and an upper conductor pattern provided on said upper major surface of said insulator layer, said upper conductor pattern establishing an electrical contact with a top surface of said conductive plug and further with an exposed side wall of said conductive plug.

According to the present invention, it is possible to form the conductive plug filing the contact hole such that the conductive plug protrudes in the upward direction from the upper major surface of the insulator layer, with reliability and also with reproducibility, as a result of use of the anisotropic etching process, which may be a reactive ion etching (RIE) process. By providing an interconnection pattern on such a protruding conductive plug, it is possible to establish an electrical contact not only at the top surface of the plug but also at the exposed side wall of the plug. Thereby, the problem of rapid decrease of the contact area associated with the alignment error at the time of exposure is successfully eliminated, and the yield of production is improved. Further, because of the positive projection of the conductive plugs, the present invention can form a distinct alignment mark in correspondence to such a plug.

Another object of the present invention is to provide a semiconductor device including an alignment structure, comprising:

a semiconductor substrate;

an insulator layer provided on said semiconductor substrate; and an alignment marker provided on said insulator layer, said alignment marker comprising:

a plurality of through holes provided in said insulator layer, with a mutual separation; and a plurality of conductive plugs filling said plurality of through holes, each of said conductive plugs protruding in an upward direction from an upper major surface of said insulation film, wherein said upper major surface of said insulation film has a first level in an area forming said alignment mark, said first level being higher than a level of said upper major surface of said insulation film outside said area.

Another object of the present invention is to provide a method of forming an alignment mark in a semiconductor device, comprising the steps of:

forming an insulation film on a semiconductor substrate;

forming a plurality of through holes in said insulation film as an alignment mark;

depositing a conductor layer on said insulation film such that said conductor layer fills said plurality of through holes;

removing said insulation film from an upper major surface of said insulation layer, a part of said insulation film filling said through holes forming thereby a plurality of conductive plugs acting as an alignment mark; and applying an anisotropic etching process to said insulation layer, such that said anisotropic etching proceeds substantially perpendicularly to said upper major surface of said insulation film and such that each of said conductive plugs has a top part exposed and protruding from said upper major surface of said insulation film, said step of forming said through holes being conducted such that said through holes are formed in said insulation film with a mutual separation set such that said anisotropic etching proceeds with a reduced rate in an area where said alignment mark is formed.

According to the present invention, the alignment mark, formed by a plurality of conductive plugs disposed with a reduced mutual separation, is easily recognized, as the level of the insulation film is higher in the area where the alignment mark is formed as compared with the level of the insulation film outside the alignment mark.

Other objects and further features of the present invention will become apparent from the following detailed description when read in conjunction with the attached drawings.

BRIEF DESCRIPTION OF THE DRAWINGS

FIGS. 3A and 3B are diagrams showing the problems pertinent to the conventional semiconductor device fabricated according to the process of FIG. 1A–1D of FIGS. 2A and 2B;

FIGS. 10A and 10B are diagrams showing a modification of the second embodiment.

DETAILED DESCRIPTION OF THE PREFERRED EMBODIMENTS

Figure 1A:
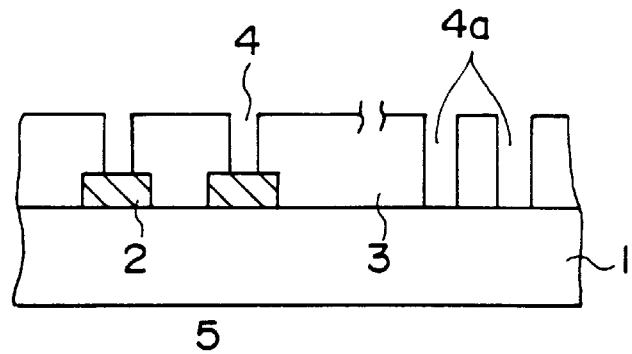
FIGS. 1A–1D are diagrams showing a conventional fabrication process of a semiconductor device including an interconnection structure.
Figure 1B:
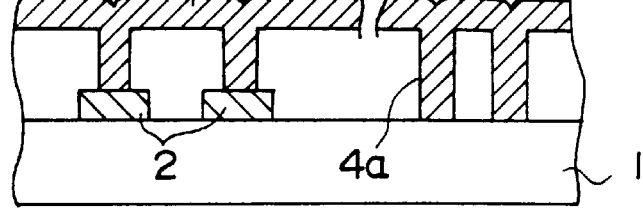
Figure 1C:
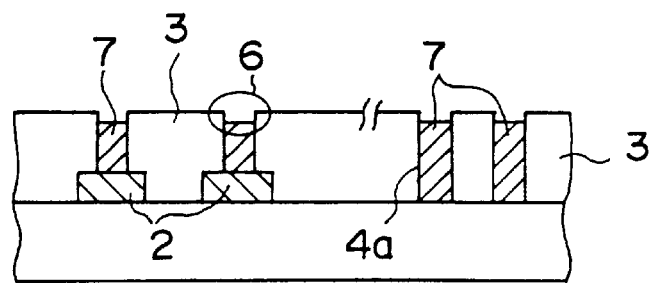
Figure 1D:
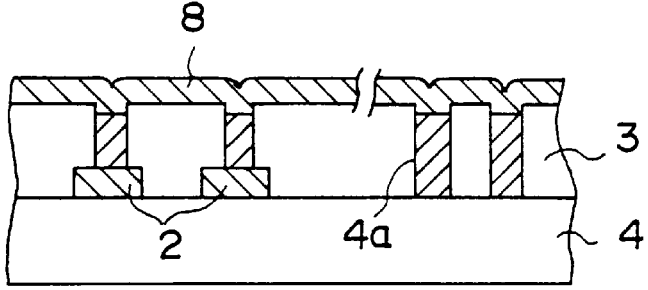
Figure 2A:
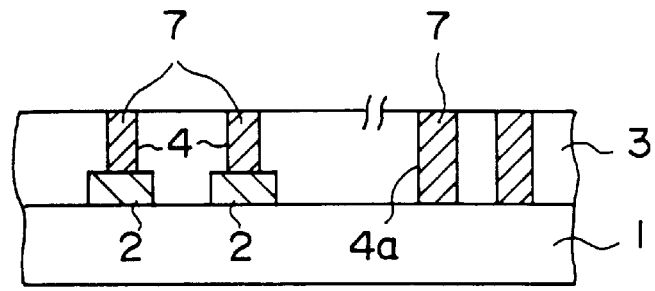
FIGS. 2A and 2B are diagrams showing another conventional fabrication process of a semiconductor device.
Figure 2B:
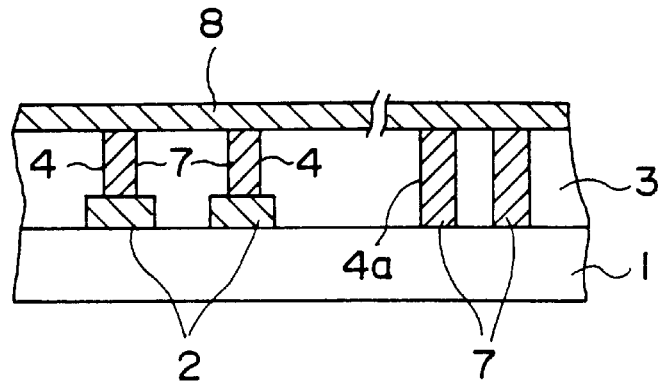
Figure 4:
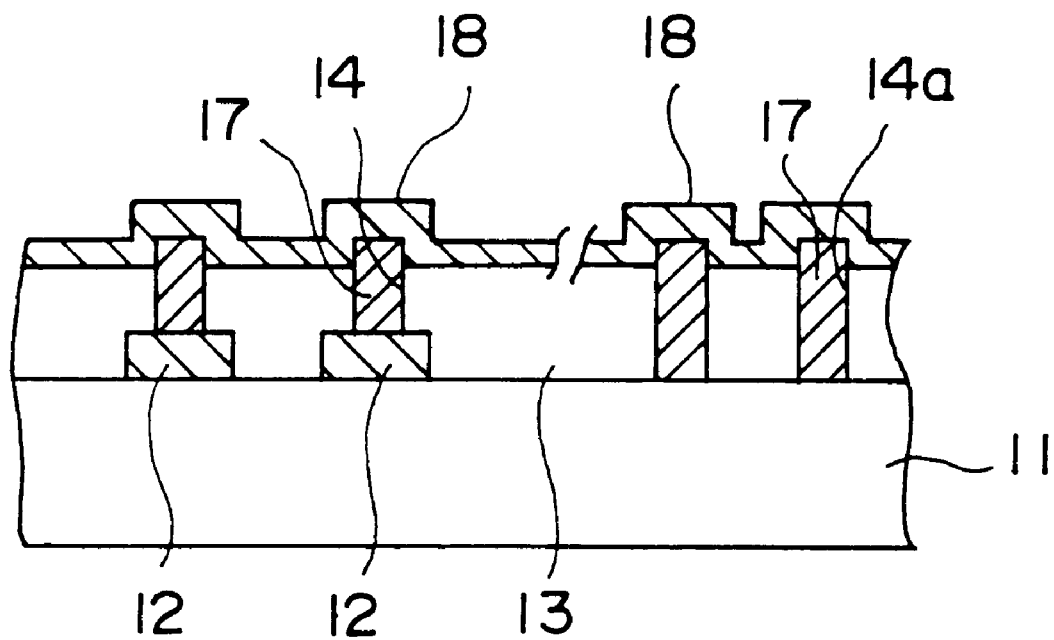
FIG. 4 is a diagram showing the construction of a semiconductor device according to a first embodiment of the present invention.

FIG. 4 shows a part of a semiconductor device according to a first embodiment of the present invention.

Referring to FIG. 4, the semiconductor device includes a Si substrate 11 carrying thereon a conductor pattern 12 of an Al-alloy formed with a thickness of 500 nm, wherein the conductor pattern 12 is covered by an insulation layer 13 of silicon oxide having a thickness of 1.2 $\mu$m.

The insulation layer 13 is formed with contact holes 14 that exposes a part of the conductor pattern 12 and further with through holes 14a that form an alignment mark.

Typically, the alignment mark is formed on substrate 12 in correspondence to scribe lines.

The contact holes 14 as well as the through holes 14a are filled with a metal such as W, wherein the metal filling the contact holes 14 or the through holes 14a form a conductive plug 17. Thereby, it should be noted that each of the conductive plugs 17 protrudes from the upper major surface of the silicon oxide film 13 in the upward direction by at least 0.1 $\mu$m, preferably about 0.4 $\mu$m. Because of the reason to be described later, it is preferable that the protrusion of the conductive plugs 17 does not exceed 0.7 $\mu$m.

On the insulation layer 13, there is provided a second layer conductor pattern 18 typically of an Al—Si—Cu alloy having a thickness of 500 nm, wherein the conductor pattern 18 covers the protruding conductive plugs 17 and establishes an electrical contact therewith, not only at the top surface of the conductive plug 17 but also at the exposed side wall of the plug 17. Thereby, the area of the electrical contact increases substantially, even when there is an alignment error between the plugs 17 and the second layer interconnection pattern 18.

It should be noted that the interconnection pattern 18 forms an alignment mark together with the protruding conductive plugs 17 underlying the pattern 18, wherein the alignment mark thus formed is suitable for the alignment detection according to the FIA (field image alignment) process that uses the art of image recognition. In the FIA process, it is desirable that an alignment mark has a height of at least 0.3 $\mu$m, while the alignment mark of the present embodiment easily satisfies this requirement.

Next, the process for forming the structure of FIG. 4 will be described with reference to FIGS. 5A–5D. In the structure of FIGS. 5A–5D, it should be noted that the details may be slightly different from the structure of FIG. 4.

Figure 5A:
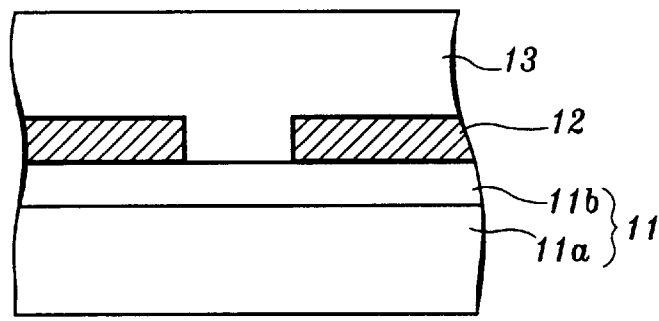
FIGS. 5A–5D are diagrams showing the fabrication process of the semiconductor device of FIG. 4.

Referring to FIG. 5A, a silicon oxide film 11b is deposited on a silicon substrate 11a by a CVD process with a thickness of about 200 nm, wherein the silicon substrate 11a and the silicon oxide film 11b form together the silicon substrate 11 of FIG. 4.

The silicon oxide film 11b thus formed carries thereon the interconnection pattern 12 of an Al—Si—Cu alloy with a thickness of about 600 nm. The interconnection pattern 12 may be formed typically by conducting a sputtering process of the Al—Si—Cu alloy, followed by a photolithographic patterning process thereof. After the interconnection pattern 12 is thus formed, the insulation layer 13 of silicon oxide is deposited on the silicon oxide film 11b so as to bury the interconnection pattern 12 underneath. In the deposition process of the insulation layer 13, the duration of deposition is controlled such that the insulation layer 13 has a thickness of about 800 nm in the part covering the interconnection pattern 12. After the deposition of the insulation layer 13, the insulation layer 13 is subjected to a CMP process, and the insulation layer 13 has a planarized upper major surface as indicated in FIG. 5A.

Figure 5B:
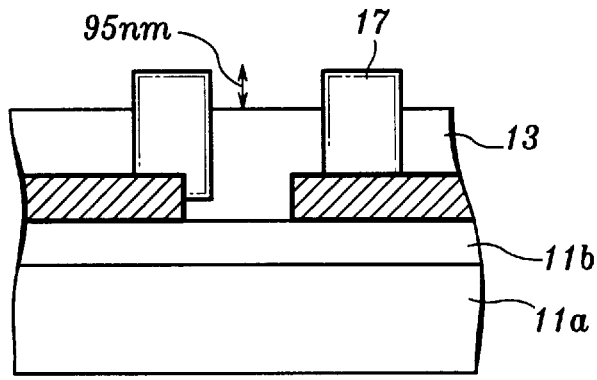

Next, in the step of FIG. 5B, the insulation layer 13 is formed with the contact holes 14 by a photolithographic patterning process, wherein each of the contact holes 14 is typically formed with a diameter of about 0.4 $\mu$m. After the contact holes 14 are thus formed, a blanket film of W (not shown) is deposited by a CVD process, such that the W fills the contact holes 14.

After the W film is thus formed, the W film is removed from the planarized upper major surface of the insulation layer 13 by an RIE process acting substantially perpendicularly to the insulation layer 13, wherein the RIE process of the W film is conducted until the upper major surface of the insulation layer 13 is exposed. As a result of such an etch-back process, the conductive plugs 17 of W are formed in the contact holes 14.

After this, another etch-back process is applied on the exposed upper major surface of the insulator layer 13 while using a mixture of $CHF_3$ and $C_2F_5$ as an etching gas, such that the insulator layer is removed selectively with respect to the conductive plugs 17. Thereby, the conductive plugs 17 protrude from the upper major surface of the insulator layer 13 by an amount of about 95 nm, for example, as indicated in FIG. 5B.

Figure 5C:
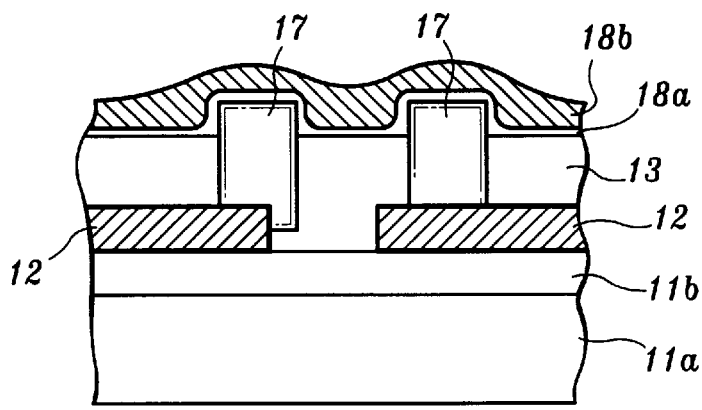

Next, in the step of FIG. 5C, a Ti film 18a is deposited on the structure of FIG. 5B with a thickness of about 50 nm by a sputtering process, followed by a deposition of an Al—Si—Cu alloy layer 18b with a thickness of about 400 nm, wherein the sputtering of the Al alloy layer 18b is conducted by a high temperature bias sputtering process in which the temperature is set first at 200° C. until the first 200 nm of the layer 18b is deposited. After this, the temperature is raised to 500° C., and the remaining 200 nm of the layer 18b is deposited at this temperature. As a result of such a high temperature bias sputtering process, the Al alloy layer 18b is substantially fluidized and achieves a step coverage of 100% in which the Al alloy layer covering the side wall of the contact hole 14 is equal to the thickness of the same Al alloy layer deposited on the upper major surface of the insulation layer 13.

Figure 5D:
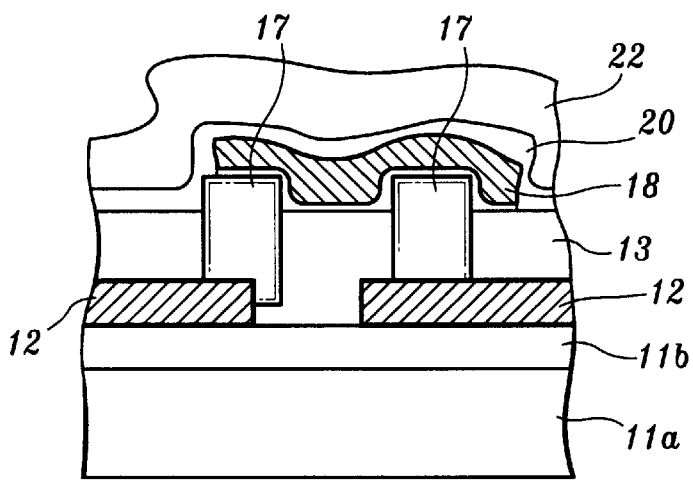

After the Ti film 18a and the Al alloy layer 18b are formed as such, the interconnection pattern 18, formed of the Ti film 18a and the Al alloy layer 18b, is patterned by a photolithographic puttering process as indicated in FIG. 5D, followed by successive depositions of a PSG (phosphosilicate glass) layer 20 and a SiN film 22, wherein the PSG layer 20 is deposited by a CVD process with the thickness of about 200 nm, while the SiN film 22 is deposited with a thickness of about 800 nm.

Figure 6A:
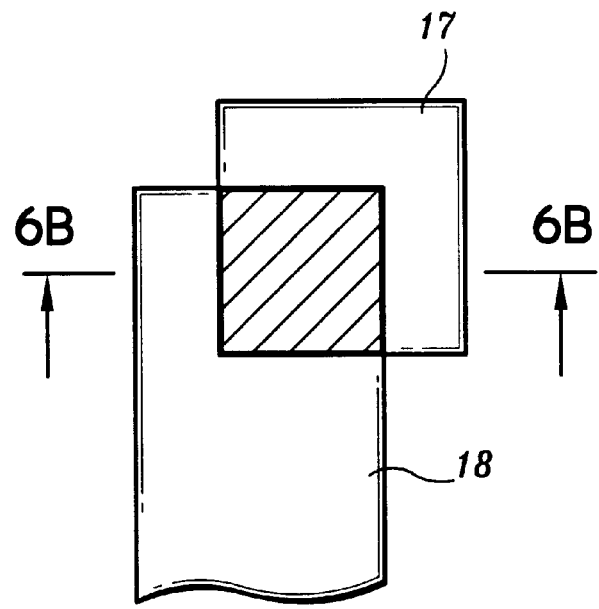
FIGS. 6A and 6B are diagrams explaining the principle of the first embodiment of the present invention.

Next, the effect of alignment error occurring in such a contact structure will be explained with reference to FIGS. 6A and 6B for the case in which the plug 17 has a circular cross section with a diameter of 0.4 µm. In FIG. 6A, the plug 17 is shown to have a square cross section, while this is merely for the convenience of illustration.

In such a case, the top surface of the plug 17 has an area of $0.126\ \mu m^2$, while the contact area on the top surface of the plug 17 is reduced to $0.098\ \mu m^2$ in the event there is an alignment error of 0.1 µm in the interconnection pattern 18 as indicated by hatching in FIG. 6A.

Figure 6B:
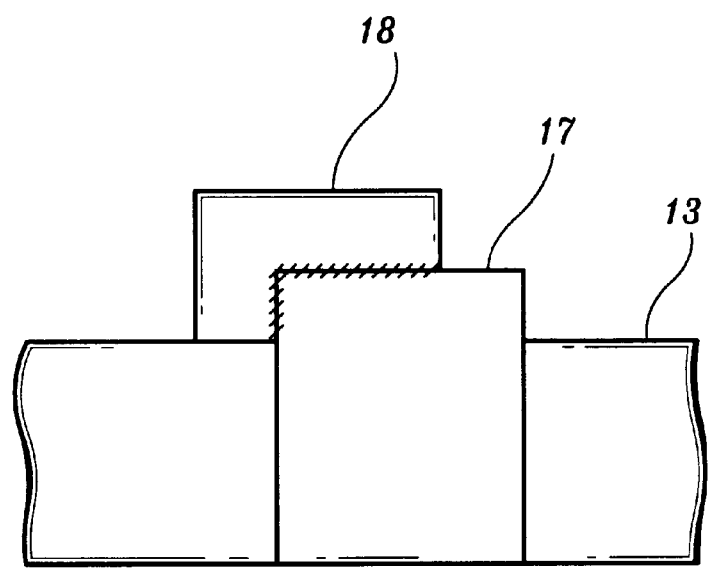

In order to compensate for such a decrease of the contact area by using the contact area at the side wall of the plug 17 as indicated in FIG. 6B and to secure the foregoing full contact area of $0.126\ \mu m^2$, it is necessary to set the amount of projection of the plug 17 to be at least 94.5 nm, which is approximately 95 nm as noted previously.

Figure 7A:
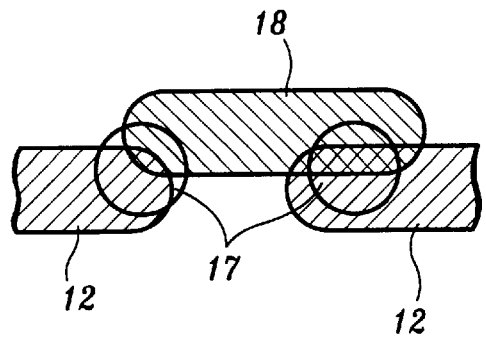
FIGS. 7A–7C are diagrams explaining the experiment conducted for the semiconductor device of the first embodiment.

Next, the result of the experiments for measuring the change of the contact resistance caused by the alignment error will be explained with reference to FIGS. 7A–7C, wherein FIG. 7A is a plan view showing the interconnection of a pair of conductor patterns each corresponding to the conductor pattern 12 by an upper layer conductor pattern corresponding to the conductor pattern 18. The conductor pattern 12 and the conductor pattern 18 are connected with each other by a conductive plug corresponding to the conductive plug 17 described previously. In the plan view, it will be noted that the conductive plug 17 has a round or circular cross section, and the edge of the conductor pattern 12 or 18 is similarly rounded.

Figure 7B:
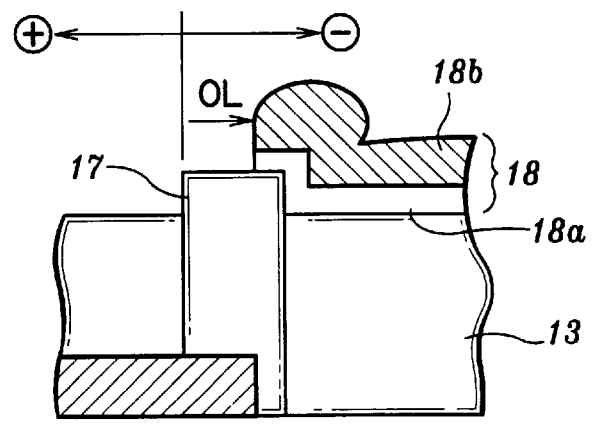

FIG. 7B shows the structure of FIG. 7A in an elevational cross section, wherein the conductor pattern 18 is formed of a lower conductor pattern of Ti corresponding to the foregoing Ti layer 18a and an upper conductor pattern of an Al alloy corresponding to the foregoing Al alloy layer 18b.

In FIG. 7B, it will be noted that the conductor pattern 18 establishes a contact not only with the top surface of the conductive plug 17 but also with the exposed side wall of the plug 17, wherein the conductor pattern 18 is offset from a nominal position by an amount OL. As a result of the offset OL, it will be noted in the enlarged view of FIG. 7C that the area of contact between the conductive plug 17 and the conductor pattern 18 is reduced.

Figure 7C:
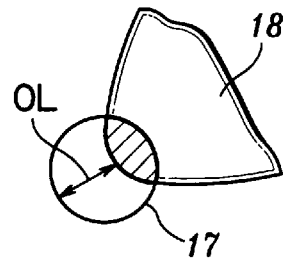
Figure 8A:
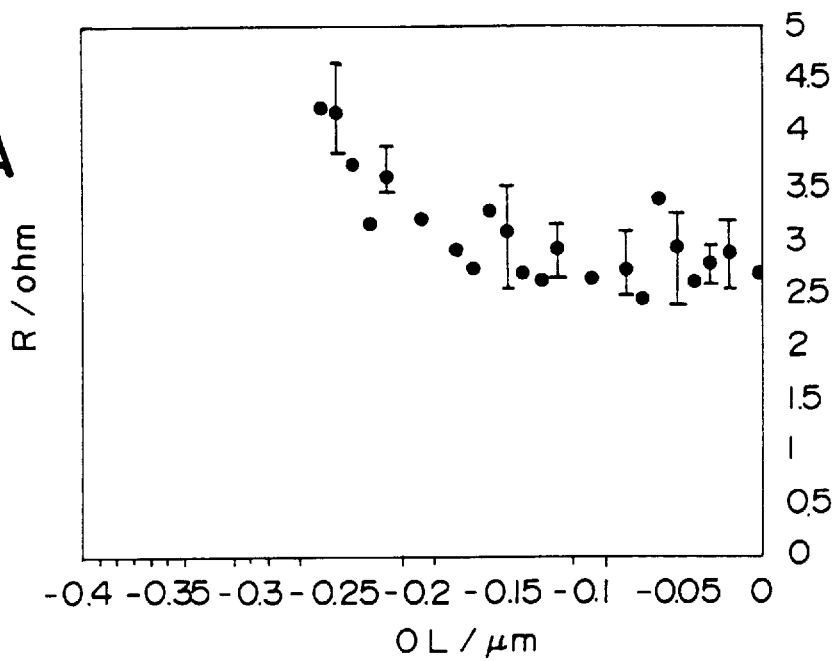
FIGS. 8A and 8B are diagrams showing the effect of the present invention achieved for the structure of FIGS. 7A–7D, in comparison with a conventional device.
Figure 8B:
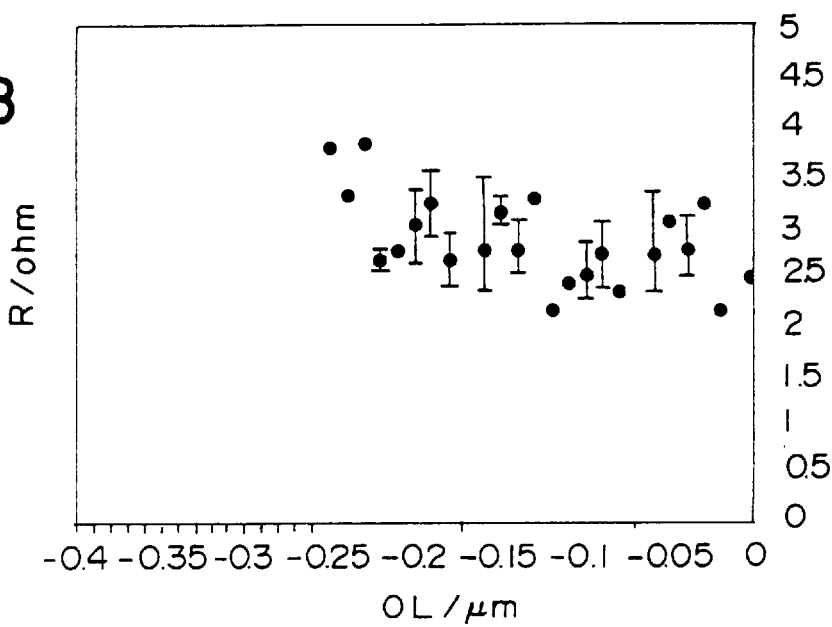

FIGS. 8A and 8B show the change of the resistance of the structure of FIG. 7C as a function of the offset OL, wherein FIG. 8A shows the conventional case in which there is no projection of the conductive plug 17 from the upper major surface of the insulator layer 13, while FIG. 8B shows the case in which the conductive plug 17 projects by 94.5 nm. In both of the experiments, the conductive plug 17 was formed to have a diameter of 0.4 µm.

Referring to FIG. 8A, it will be noted that the resistance of the contact structure starts to increase when the amount of offset OL has exceeded 0.16 µm in the negative direction corresponding to the negative direction of FIG. 7B, while no substantial increase of resistance is observed for the structure of FIG. 8B until the amount of offset OL exceeds 0.22 µm in the negative direction.

Next, a second embodiment of the present invention will be described with reference to FIGS. 9A–9E, wherein those parts described previously are designated by the same reference numerals and the description thereof will be omitted.

Figure 9A:
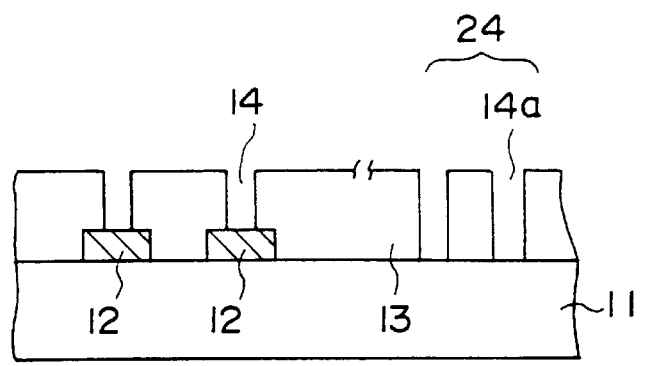
FIGS. 9A–9E are diagrams showing the fabrication process of a semiconductor device according to a second embodiment of the present invention.

In the present embodiment, a plurality of through holes 14a are formed in the step of FIG. 9A in the planarized insulation layer 13 in correspondence to an alignment mark 24 to be formed, simultaneously with the formation of the contact holes 14.

Figure 9B:
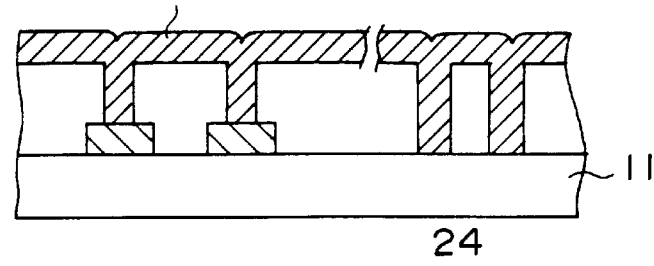

Next, in the step of FIG. 9B, a conductor layer 15 of W is deposited on the structure of FIG. 9A such that the W layer 15 fills the contact holes 14 as well as the through holes 14a forming the alignment mark 24.

Figure 9C:
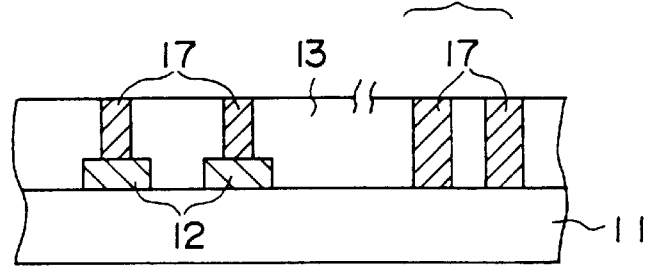

Next, in the step of FIG. 9C, a CMP process is applied to the W layer 15 such that the W layer is removed completely from the planarized upper major surface of the insulation layer 13. As a result of the CMP process, the conductive plugs 17 of W are formed in the contact holes 14 as well as in the through holes 14a.

Figure 9D:
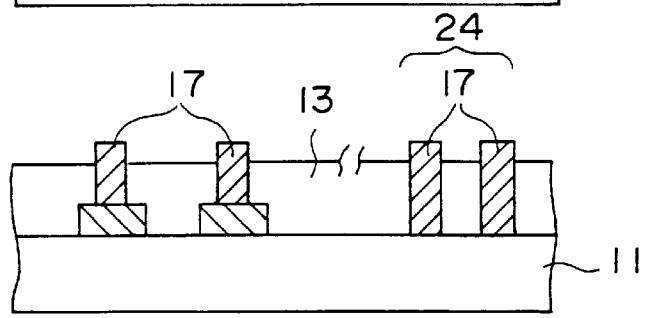

Next, in the step of FIG. 9D, an RIE process is applied selectively to the upper major surface of the insulation layer 13 such that the surface of the insulation layer 13 is etched substantially perpendicularly by an amount of 0.3 µm or more. The RIE process uses a $CF_4$ etching gas and is continued for a duration of about 40 seconds. Thereby, the conductive plugs 17 protrude from the upper major surface of the insulator layer 13 in the upward direction by 0.3 µm or more, both in the contact holes 14 and in the through holes 14a. When using a $CF_4$ etching gas in the foregoing RIE process, it should be noted that the exposed surface of the W conductive plug 17 is covered by a protective film, and thus, the W plug 17 is protected from the etching.

Further, in the step of FIG. 9E, a further conductor pattern is deposited on the structure of FIG. 9D and patterned subsequently, to form the conductor pattern 18. Thereby, the conductor pattern 18 not only covers the conductive plugs 17 filling the contact holes 14 but also the conductive plugs 17 filling the through holes 14a and hence forming the alignment mark 24.

Figure 9E:
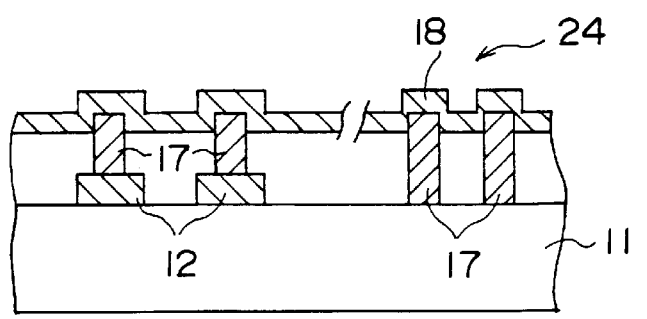

In the structure of FIG. 9E, it should be noted that the alignment mark 24 shows a projection corresponding to the projection of the conductive plugs 17. Thereby, the alignment mark 24 is easy to detect, and a reliable alignment becomes possible by using the alignment mark 24.

FIG. 10A shows a modification of the previous embodiment.

In the process of FIG. 9E, it is usual to deposit an Al alloy as the conductor pattern 18 by a high temperature bias sputtering process, wherein the Al alloy layer thus deposited has an excellent fluidity and hence shows an excellent step coverage of the projecting conductive plugs 17. On the other hand, this superior fluidity of the Al alloy layer tends to reduce the step height on the conductor pattern 18 and hence obscure the projection of the alignment mark 24. In such a case, the detection of the alignment mark 24 becomes unreliable.

In order to avoid this problem, the embodiment of FIG. 10A forms the conductive plugs 17 with a reduced mutual separation $L_1$ in each alignment mark such as a mark 24A or a mark 24B, as compared with a separation $L_2$ between a conductive plug 17 forming a part of an alignment mark, such as the mark 24A, and an adjacent conductive plug 17 forming a part of an adjacent structure, which adjacent structure may be the adjacent alignment mark 24B as in the case of FIG. 10A or may be an adjacent pattern. In the structure of FIG. 10A, it should be noted that each of the conductive plugs 17 has a diameter $L_3$.

FIG. 10B shows the etching rate of a $SiO_2$ film forming the insulator layer 13, for various mutual separations of the conductive plugs 17 at the time of the RIE process of FIG. 9D. It will be noted from FIG. 10B that the etching rate is reduced substantially when the separation between adjacent plugs 17 is reduced, for example below 0.7 μm. In other words, the result of FIG. 10B indicates that one can suppress the etching of the insulation layer 13 for the part forming the alignment mark 24A or 24B, by merely setting the mutual separation $L_1$ of the conductive plugs 17 to be about 0.7 μm or less in the alignment mark. On the other hand, the mutual separation $L_2$ is set sufficiently larger than $L_1$ for the part outside the alignment mark 24A or 24B. For example, the separation $L_2$ may be set ten times or more of the mutual separation $L_1$ ($L_1 \leq 0.7$ μm, $L_2 \geq 10L_1$). Further, the diameter $L_3$ of the plug 17 may be set smaller than about 1.0 μm ($L_3 \leq 1.0$ μm).

By forming the conductive plugs 17 as set forth above, the level of the upper major surface of the insulator layer 13 forming the alignment mark 24A or 24B is maintained above the level of the insulator layer 13 located outside the alignment mark, and a distinct step is guaranteed at the periphery of the alignment mark as indicated in FIG. 10A.

In the present embodiment, it is of course possible to increase the number of the conductive plugs 17 in each alignment mark to be more than three.

In the present invention described heretofore, it should be noted that the material forming the conductive plug 17 is by no means limited to W, but other materials such as Al—Si alloy, Al—Cu alloy, Al—Si—Cu alloy, Al, Ti, TiN, $TiSi_2$, $Ti_3Al$, Cu, W, WSi or Au may be used.

Further, it should be noted that the interconnection pattern 12 or 18 is by no means limited to the one described before but may be selected from one or more of Al—Si alloy, Al—Cu alloy, Al—Si—Cu alloy, Al, Ti, TiN, $TiSi_2$, $Ti_3Al$, Cu, W, WSi and Au.

Further, the present invention is not limited to the embodiment described heretofore, but various variations and modifications may be made without departing from the scope of the invention.

What is claimed is:

1. A method of fabricating a semiconductor device, comprising the steps of:

forming an insulator layer on a semiconductor substrate;

forming a plurality of contact holes in said insulator layer such that said plurality of contact holes extend from an upper major surface of said insulator layer to a lower major surface of said insulator layer;

depositing a conductor layer on said insulator layer such that said conductor layer fills said plurality of contact holes;

removing said conductor layer from said upper major surface of said insulator layer, said removing step thereby forming a plurality of conductive plugs, of a conductive material identical to a conductive material forming the conductor layer, such that said plurality of conductive plugs fill said plurality of contact holes;

after said plurality of conductive plugs are formed, applying an anisotropic etching process upon said insulator layer, such that said anisotropic etching process acts substantially vertically and selectively to said insulator layer, with an etch rate substantially larger than an etching rate for said conductive plugs, whereby said anisotropic etching process is applied to intentionally overetch the insulator layer until each of said plurality of conductive plugs extends at least approximately 95 nm above said insulator layer.

2. A method as claimed in claim 1, wherein said anisotropic etching process is a reactive ion etching process using a fluoride etching gas.

3. A method as claimed in claim 1, wherein said conductor layer is selected from a material consisting of: an Al—Si alloy, an Al—Cu alloy, an Al—Si—Cu alloy, Al, Ti, TiN, $TiSi_2$, $Ti_3Si$, Cu, W, WSi and Au.

4. A method as claimed in claim 1, wherein said step of anisotropic etching is conducted such that said insulator layer is removed by a thickness of at least about 0.1 μm.

5. A method as claimed in claim 1, wherein said step of anisotropic etching is conducted such that said insulator layer is removed by a thickness of about 0.4 μm.

6. A method as claimed in claim 4, wherein said step of anisotropic etching is conducted such that said insulator layer is removed by a thickness not exceeding 0.7 μm.

7. A method as claimed in claim 1, further comprising, after said step of applying an anisotropic etching process, a step of forming an upper level conductor pattern on said upper major surface of said insulation layer, such that said upper level conductor pattern establishes a contact with a top surface of said conductive plug and further with an exposed side wall of said conductive plug.

8. A method as claimed in claim 1, further comprising, before said step of forming said insulator layer, a step of providing a lower level interconnection pattern on said semiconductor substrate at a level below said insulator layer, wherein said contact hole is formed in said insulator layer such that said contact hole exposes said lower level interconnection pattern.

* * * * *